United States Patent [19]

Palanisamy

[11] Patent Number: 5,049,803

[45] Date of Patent: Sep. 17, 1991

[54] METHOD AND APPARATUS FOR CHARGING AND TESTING BATTERIES

[75] Inventor: Thirumalai G. Palanisamy, Morristown, N.J.

[73] Assignee: Allied-Signal Inc., Morris Township, Morris County, N.J.

[21] Appl. No.: 350,071

[22] Filed: May 10, 1989

[51] Int. Cl.⁵ .......................... H02J 7/04; H02J 7/10; H01M 10/44

[52] U.S. Cl. ....................................... 320/20; 320/21; 320/39; 320/48

[58] Field of Search ....................... 320/20, 21, 39, 40, 320/48, 18

[56] References Cited

U.S. PATENT DOCUMENTS

| | | | |
|---|---|---|---|
| 4,333,149 | 6/1982 | Taylor et al. | 320/48 X |
| 4,396,880 | 8/1983 | Windebank | 320/21 |
| 4,583,034 | 4/1986 | Martin | 320/21 |
| 4,639,655 | 1/1987 | Westhaver et al. | 320/20 X |
| 4,677,363 | 6/1987 | Kopmann | 320/20 X |
| 4,742,290 | 5/1988 | Sutphin et al. | 320/21 |
| 4,745,349 | 5/1988 | Palanisamy et al. | 320/39 X |
| 4,746,854 | 5/1988 | Baker et al. | 320/21 X |
| 4,876,495 | 10/1989 | Palanisamy et al. | 320/18 |

FOREIGN PATENT DOCUMENTS 0067589 12/1982 European Pat. Off. .
0067590 12/1982 European Pat. Off. .

Primary Examiner—R. J. Hickey
Attorney, Agent, or Firm—Ernest D. Buff; Gerhard H. Fuchs

[57] ABSTRACT

An apparatus for charging and testing a rechargeable battery is adapted to determine certain conditions, including defects and characteristics, of the battery. The apparatus detects defects caused by sulfated cells, short circuited cells, and mismatched cells, and determines battery voltage, capacity and charge acceptance capability.

21 Claims, 12 Drawing Sheets

Detection of Gas Point Using Current Ramp at SOC=100%

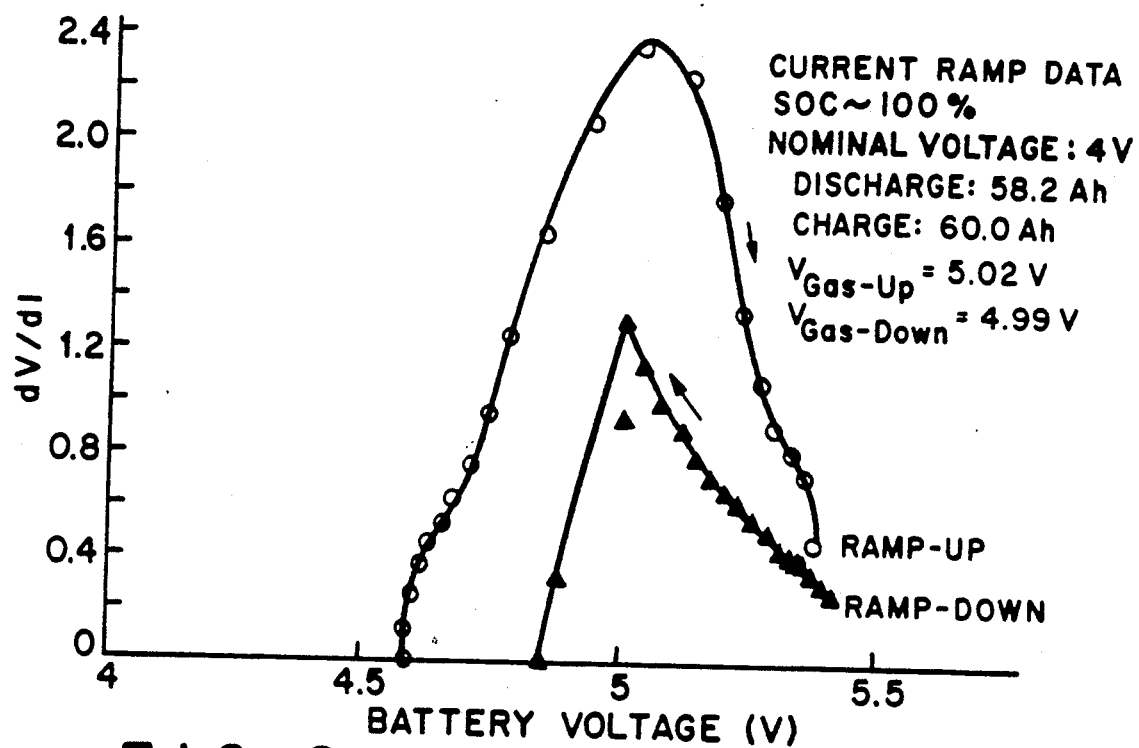
FIG. 6 Determination of Gas Voltage Using Current Ramp at SOC = 100%
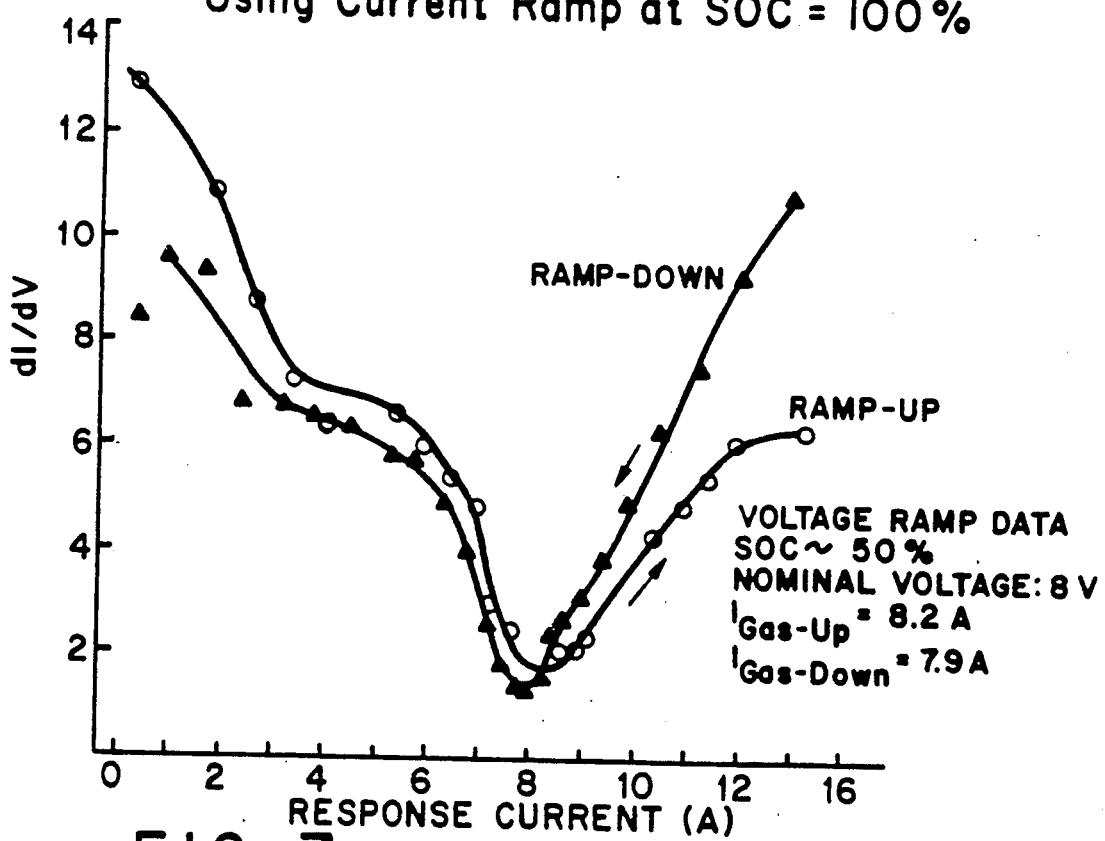
FIG. 7

METHOD AND APPARATUS FOR CHARGING AND TESTING BATTERIES

CROSS REFERENCE TO RELATED APPLICATIONS

This application is related to U.S. application Ser. No. 919,417, filed Oct. 16, 1986, now U.S. Pat. No. 4,745,349, entitled "Apparatus and Method for Charging and Testing Batteries".

BACKGROUND OF THE INVENTION

1. Field of the Invention

This invention relates to a method and apparatus, for charging and testing rechargeable batteries, especially lead-acid batteries of any capacity and voltage. More particularly, this invention relates to such a method and apparatus by which the characteristics of the battery, such as fault conditions are diagnosed in detail, and in which charging characteristics and the battery is charged with maximum efficiency and speed.

2. Prior Art

Methods and apparatus for determining the true capacity, nominal voltage, state of charge, defect, gassing, charge acceptance, and other characteristics of the battery. Manual determination of these parameters is expensive and time consuming. With the introduction of microprocessor based autonomous chargers these operating characteristics are determined automatically and the battery is charged under optimum conditions.

Typically, the industrial lead-acid batteries have charge capacities of hundreds of ampere-hours. For maximum utilization, these batteries should be recharged quickly for the next use cycle. To prevent damage to the battery, it should be recharged soon after its used. The battery charger should be simple to operate, and should warn the user of battery defects and when to change the battery. It is desired that defective and unsafe conditions of the battery during charge should be indicated.

Some early commercial chargers employed constant charging current for a preset duration. Depending on the charge time available (the time the battery should be ready for use) and the capacity, the operator sets the charging current level. The efficiency of this type of charger is low, since state of charge (SOC) is not taken into account. Even with low initial SOC, the battery may evolve gas significantly in the last quarter of the charging cycle.

Some other chargers use constant voltage charging techniques for a specified time selecting a charge voltage which is lower than the gas voltage. This method may often lead to undercharging. Theoretically it takes an infinite time to charge, without gassing, a battery completely by this method since the charge current decreases asymptotically.

A charger from Westinghouse Devenset Rectifier of England employs another variation of this technique. The battery is supplied with a charging current until the battery voltage reaches a predetermined level corresponding to the gas evolution voltage (Vgas). The charging is continued from this stage by a timer for a specified period, followed by an equalizing charge. The battery is then placed under trickle charge to compensate for the open circuit self-discharge loss. The energy loss during the timer controlled charge period is still considerable and detrimental to the battery.

The charger introduced by Oldham/Harmer & Simmons of England passes a charging current to the battery until the voltage rises to the gas evolution voltage. The charger then alternates between a measuring cycle and a charging cycle. In the measuring cycle, the charge current is measured while the battery is charged under the constant voltage mode corresponding to the gas voltage. The charge is terminated when the currents in two successive measuring cycles are equal.

A charger employing periodic discharge pulses during the charge regime has been commercialized by Christie Electric Corp. The state of charge is derived from the current during the discharge pulse. This charger has been designed for small low capacity batteries.

The prior art has also described chargers using computers/microprocessors to perform analytical and control functions. One of the earliest chargers of this type analyzes voltage-current (I-V) characteristics during an applied current ramp to the battery. The I-V data is determined for each cell in the battery and compared with the average of all the cells. If any cell exhibits significantly different characteristics, the battery is diagnosed as defective. However, for practical purposes the cells in batteries are often inaccessible.

Another charger of this class uses the slope of the voltage current curve, obtained from the I-V characteristics as described above, to determine the state of charge of the battery. This is accomplished by comparing the above slope with those of average I-V characteristics of similar batteries at various charge levels (SOCs).

Yet another microprocessor based charger that uses I-V characteristics of current ramping test cycle has been proposed in EP Nos. 067589 and 067590. The I-V characteristics of the batteries of different capacities (within a narrow limit) and states of charge are stored in memory. They are compared with that of the battery being charged to determine SOC. If no match is found, the charger assumes a fault condition and calls for the attention of the operator. The battery is charged until the I-V characteristics are almost the same in successive test cycles.

All the chargers proposed in the state of the art are limited to batteries of certain nominal voltage and capacity within a narrow range. The fault-detecting diagnostics are also limited. For example, mismatched cells and soft-shorted cells are not signaled separately. Clearly, there is a need for a charger that can automatically identify the operating characteristics of the battery, detect fault conditions, and carry out charging with high efficiency and speed.

SUMMARY OF THE INVENTION

This invention provides an apparatus for charging and testing a rechargeable battery, as for example a lead acid battery, of any capacity and voltage to determine certain conditions, including defects and characteristics, of the battery. Generally stated, the apparatus comprises a microprocessor means for controlling the operations of the apparatus. A software means instructs the microprocessor means to control the sequence of the operations. Memory means are connected to the microprocessor means for storing the software instructions, predetermined data and cell characteristics of the batteries.

A digital to analog converter means is connected to the microprocessor means for converting digital signals from the microprocess or means to analog signals. The digital to analog converter means has connected thereto a direct current power generator means, for producing electric power at required voltage and current, as commanded by the microprocessor means. The apparatus has a pair of output means, for connection to the battery. A current sensor means, connected to the output means measures the current passing through the output means to and from the battery. A voltage measuring means measures the voltages of the battery, current sensor and direct current power generator means. An analog to digital converter means, is connected to the voltage measuring means, for converting the analog signals from the voltage measuring means to digital signals for transmission to the microprocessor.

A second software means analyzes the current and voltages for determining number of cells, capacity, state of charge and defects in the battery. The apparatus further comprises an actuator means... for controlling the electrical circuits connecting the current and voltage sensors, the direct current power generator means and the battery. A control means is connected to the power generator means for controlling the voltage and current supplied by the power generator means to the battery. A display means, controlled by the microprocessor means indicates the battery status and the status of apparatus, and advice.

In one aspect of the invention, the power generator means of the apparatus comprises means for generating direct current supplied to the battery, the value of the current being determined according to a predetermined function of time by the software means in conjunction with the memory means and voltage measured by said voltage measuring means.

In another aspect of the invention, the power generator means of the apparatus comprises means for generating dc voltage applied to the battery, the value of the voltage being determined according to a predetermined function of time by the software means in conjunction with the memory means and current measured by the voltage measuring means.

The software means of the apparatus comprises means for determination of minimum, maximum and true number of cells in the battery, means for controllably varying voltage and current applied to the battery, means for determination of gas point of the battery, means for detecting defect conditions of the battery and means for determining the capacity and state of charge of the battery.

In addition, this invention provides a method of testing a rechargeable battery, which comprises the steps of:

(a) measuring the open circuit voltage of said battery and estimating the number of cells possible for the measured open circuit voltage;

(b) supplying a controllably varying charging current or voltage to the battery for a predetermined period of time while measuring the response voltage or current produced at or through the battery terminals and testing said battery for the evolution of gas;

(c) charging said battery automatically at any charge rate until the battery charge voltage equals the estimated number of cells of the battery multiplied by a predetermined voltage which is characteristic of the battery;

(d) repeating steps (a), (b) and (c) until step (b) indicates the evolution of gas;

(e) determining the current ("Igas-up") and voltage ("Vgas-up") at which said battery evolves gas in the increasing current direction, and the current ("Igas-down") and voltage ("Vgas-down") at which the battery stops evolving gas in the decreasing current direction;

(f) determining the true number of cells in the said battery from Vgas-up and/or Vgas-down;

(g) determining the state of charge using the true number of cells determined in step (f), the open circuit voltage measured in step (a) and the charge input to said battery by the apparatus;

(h) determining the capacity of said battery from said Igas-up when said Igas-down is lower than or equal to a predetermined value, or from the difference in said Igas-up and Igas-down when said Igas-down is greater than or equal to a predetermined value;

(i) determining defect conditions from the open circuit voltage; and (j) determining defect conditions from the current-voltage characteristics generated in step (b).

Another method of this invention comprises the following steps, in addition to the above steps:

(a) charging the battery automatically at any charge rate until the battery voltage equals the true number of cells multiplied by a predetermined voltage which is characteristic of the battery;

(b) charging the battery at a constant voltage equal to voltage in step (a) until the charge current decreases to a predetermined low value;

(c) charging the battery with a predetermined constant current at any voltage for a predetermined period of time;

(d) repeating steps (b) and (e) in previous method and step (c) in this method until said Igas-down reaches a predetermined lower limit which is characteristic of the desired state of charge of the battery; and (e) determining the battery's capability to accept charge from the charge input to said battery.

A method of this invention estimates the number of cells in the battery using the minimum number of cells estimated by the formula:

$$minimum\ number\ of\ cells = (OCV/V_1)$$

wherein the value of $V_1$ corresponds to the cell voltage of a completely charged cell and OCV is the open circuit voltage.

Another method of this invention estimates the number of cells in the battery using the maximum number of cells estimated by the formula:

$$maximum\ number\ of\ cells = (OCV/V_2)$$

wherein the value of $V_2$ corresponds to the cell voltage of a completely discharged cell and OCV is the open circuit voltage of said battery.

A method of this invention determines the true number of cells from the maximum number of cells (MAXCEL) when the estimated number of cells is smaller than a predetermined value.

This invention provides a method to charge the battery until the battery voltage equals the minimum number of cells times a predetermined value characteristic of the battery..

A method of this invention determines the true number of cells by dividing Vgas by $V_3$ wherein $V_3$ is a value characteristic of the battery type.

A method of this invention to determine gas point parameters comprises the steps of:

(a) monotonously increasing the battery voltage over a predetermined period of time from the open circuit voltage to a predetermined high limit voltage which is characteristic of the type of battery, holding said voltage at said high limit value for a predetermined period of time, and monotonously decreasing the battery voltage from said high limit value over a predetermined period of time to the open circuit voltage;

(b) measuring the response current and/or impedance during said increasing and decreasing voltage;

(c) analyzing the data using the differential $dI/dV$ vs. I and/or V, wherein I is the current and V is the voltage, or $dZ/dV$ vs. I and/or V wherein I is the current, V is the voltage and Z is the impedance; and (d) determining the gas evolution parameters by the presence of one or more minima in $dI/dV$ or $dZ/dV$ in the increasing voltage direction and the gas stopping point by the presence of one or more minima in $dI/dV$ or $dZ/dV$ in the decreasing direction of said voltage.

Another method of this invention to determine gas point parameters comprises the steps of:

(a) monotonously increasing the battery voltage over a predetermined period of time from the open circuit voltage to a predetermined high limit voltage which is characteristic of the type of battery, holding said voltage at said high limit value for a predetermined period of time, and monotonously decreasing the battery voltage from said high limit value over a predetermined period of time to the open circuit voltage;

(b) measuring the response current during said increasing and decreasing voltage;

(c) analyzing the data using the differential $dI/dV$ vs. I and/or V, wherein I is the current and V is the voltage, and (d) determining the gas evolution parameters by the presence of one or more minima in $dI/dV$ in the increasing voltage direction and the gas stopping points by the presence of one or more minima in $dI/dV$ in the decreasing direction of said voltage.

This invention provides a method of detecting reverse connection of the battery leads to the apparatus, wherein the measured open circuit voltage is less than a predetermined voltage, particularly $-1$ V.

A method of this invention detects improper connections of the battery to the apparatus using the measured open circuit voltage when it is less than a predetermined voltage and higher than another predetermined voltage.

A method of this invention detects a defective battery condition wherein the open circuit voltage is greater than a predetermined voltage and substantially zero current flows through the battery in response to an applied voltage substantially greater than the open circuit voltage. On detecting the above conditions, this invention indicates the presence of one or more of the following defective conditions:

(a) Bad connections;
(b) Corroded terminals
(c) Loss of electrolyte
(d) Bad relay type components in the apparatus A method of this invention detects a battery having cells mismatched in capacity wherein said mismatch is indicated by the presence of multiple gas evolution points in the increasing current or voltage direction and one or more gas stopping points in the decreasing current or voltage direction.

A method of this invention detects a battery defect caused by sulfated cell(s) wherein said defect is indicated by the presence of one or more current-voltage inflections in the increasing current or voltage direction coupled with the absence of corresponding gas stopping point in the decreasing current or voltage direction.

A method of this invention detects a battery defect caused by soft-shorted cell(s) wherein said defect is indicated by a disproportionately low value of Igas-up for the gas evolution points or a jump of a minimum predetermined increase in the open circuit voltage of the battery due to the applied current or voltage ramp to the battery.

A method of this invention determines the internal resistance of the battery from two sets of Igas-up and Vgas-up parameters generated from the voltage or current ramps, each of said sets corresponding to different states of charge of said battery.

A method of this invention detects a defective battery wherein said defect is indicated by comparing the determined internal resistance with the corresponding value characteristic of said battery size and capacity stored in the memory means.

Another method of this invention used to determine the gas point parameters comprises the steps of:

(a) monotonously increasing the battery current over a predetermined period of time from zero or substantially zero current to a predetermined high limit current and holding said current at said high limit value for a predetermined period of time and monotonously decreasing said current from said high limit value over a predetermined period of time to zero or substantially zero current;

(b) measuring the response battery voltage and/or impedance during said increasing and decreasing current;

(c) analyzing the data using the differential $dV/dI$ vs. I or V, wherein I is the ucrrent and V is the voltage, or $dZ/dI$ vs. I or V wherein I is the current, V is the voltage and Z is the impedance; and (d) determining the gas evolution parameters by the presence of one or more maxima in $dV/dI$ or $dZ/dI$ in the Through use of the method of this invention secondary batteries can be charged with maximum efficiency and speed, without shortening the life of the battery by exposure to severe charging conditions. Moreover, the method of this invention can be used to detect fault conditions in the battery, and to determine battery capacity, state of charge and nominal battery voltage. Furthermore, the method of this invention is suitable for use with batteries of all type and sizes, and can be used without the need for predetermined operational characteristics.

BRIEF DESCRIPTION OF THE DRAWINGS

. The following detailed descriptions, given by way of example, will be best understood in conjunction with the accompanying drawings in which:

FIG. 6 is a plot of dV/dI versus battery voltage using a current ramp with a battery at 100% state of charge.

FIG. 7 is a plot of dI/dV versus battery current using a voltage ramp with a battery at 50% state of charge.

DESCRIPTION OF THE PREFERRED EMBODIMENT

Figure 1:
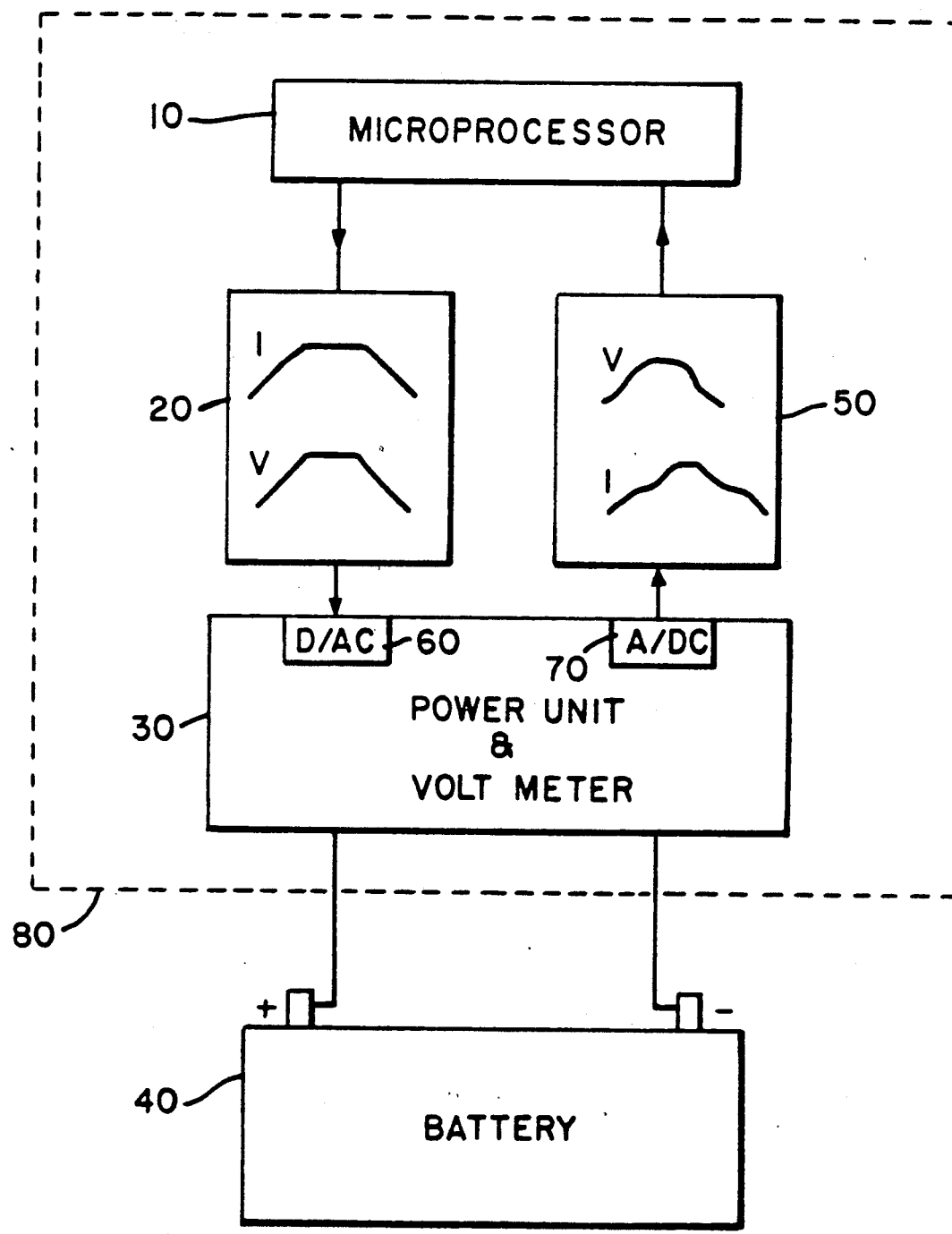
FIG. 1 is a block diagram of an apparatus capable of carrying out the method of the present invention.

Charger 80 illustrated in FIG. 1 consists of a microprocessor 10 and power unit 30 attached to a battery 40. Microprocessor 10 and power unit 30 may be put together in one unit as an "intelligent" power supply or may exist as two individual units interfaced with appropriate software and hardware. Microprocessor 10 sends commands 20 to power unit 30 and thus control its performance and operating characteristics. Microprocessor 10 is controlled by the software incorporated in its memory. Microprocessor 10 also analyzes data 50 received from power unit 30 and determines appropriate action and further course of the charging process.

Power unit 30 merely functions as a slave to microprocessor 10 and outputs current and/or voltage as commanded by microprocessor 10. In addition to the power output (voltage/current), power unit 30 preferably can close and open the charging circuit. Power unit 30 preferably also has diodes to protect the battery 30 discharging into power unit 30. Power unit 30 preferably has subassembly resembling voltmeter which is capable of measuring battery voltage and the charge current through a shunt or similar device. There is no difference in the hardware connections for the ramp cycle and the charge cycle. Their difference is only in the software commands sent by microprocessor 10 to power unit 30 and hence the power (voltage and/or current) output. Power unit 30 preferably has a digital to analog converter 60 which converts digital commands 20 received from microprocessor 10 into analog signals that control the functions of the power unit. Power unit 30 also has an analog to digital converter 70 which transforms the analog data from power unit 30 to digital data 50 and sends the same to microprocessor 10. The system consisting of microprocessor 10, the software and power unit 30 with all its accessories hereafter is referred to as the charger 80.

Power unit 30 has a starter switch (not shown) which is switched on to start the charging process after battery 40 is connected to charger 80. In addition, power unit 30 has a manual/auto switch (not shown). In manual position, charger 80 allows the operator to fix the charging current and voltage and also permits the user to control all the functions of charger 80 manually. In the auto position, charger 80 controls all functions automatically according to the battery characteristics, detects faulty conditions, if any, and charges most efficiently and quickly.

Battery 40 is any type of rechargeable battery such as nickel-cadmium, nickel-hydrogen, lead-acid, nickel-zinc, nickel-iron, silver-zinc, zinc bromine, zinc-chlorine and the like. However, in the preferred embodiments of the invention, lead-acid batteries are used.

The following description of the drawings which refer to any type of lead-acid battery, is for illustration purposes only, and should not be construed as limited to the said battery type. It is appreciated, however, that certain parameters as for example the cell voltage corresponding to completely discharged and charged states, and gas voltage will have different values, depending on the specific type of battery, and should be properly incorporated into the software commands. The lead-acid battery consists of plurality of cells depending on the voltage requirement of the application. Each lead-acid cell has a voltage of about 2.2 V when fully charged and a voltage of 2 V when fully discharged. These values can be higher or lower depending on the polarization or the rest period after the battery's last charge or use. The cell voltage lies between these values for intermediate states of charge. The capacity of the battery can be of any value ranging from a few Ah to hundreds or even thousands of Ah depending on the application.

All control and measurement functions are initiated and commanded by microprocessor 10 and they are executed by power unit 30. For example, to generate a linearly increasing voltage ramp, microprocessor 10 initially sets up a limit for the voltage and current output. Depending on the slope of the voltage ramp, resolution and total response times of microprocessor 10 and power unit 30, microprocessor 10 periodically sends commands 20 to power unit 30 requiring the appropriate voltage output. Power unit 30 then waits for a predetermined period, measures the response current and passes data 50 to microprocessor 10, which then commands power unit 30 to output the next required voltage level. This sequence continues until the set limit of the voltage or current is reached, whichever happens earlier. During the above sequence, the current passing through the battery 40 is predominantly determined by the battery's characteristics, as for example battery capacity, internal resistance and state of charge.

Figure 2:
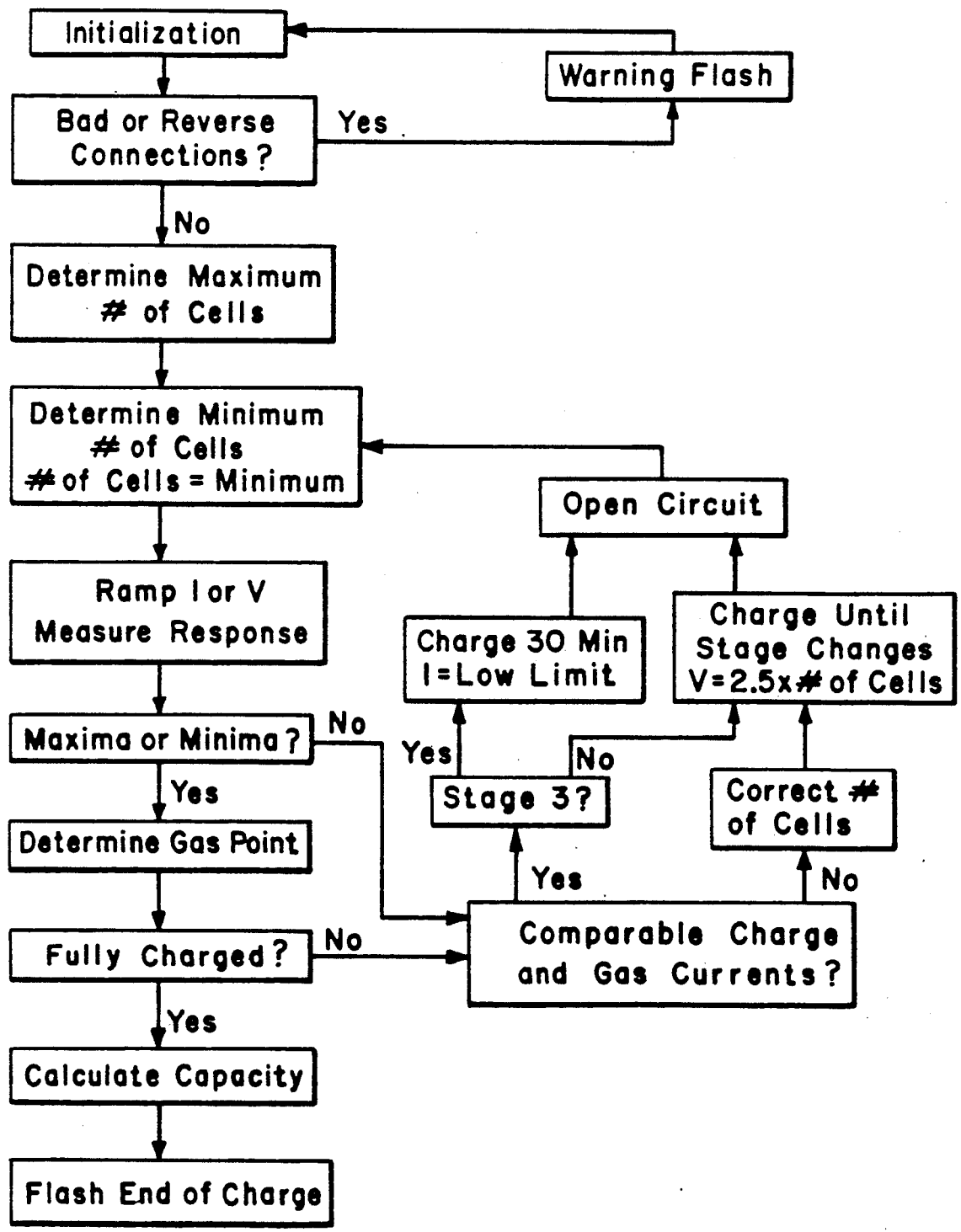
FIG. 2 is a flow diagram of a preferred embodiment of this invention.

A flow chart of a predetermined method of operating charger 80 is shown in FIG. 2. When battery 40 is connected to charger 80 and started, all variables such as the number of cells (NOC), state of charge (SOC), maximum (MAXCEL) and minimum (MINCEL) number of cells, battery capacity (CELCAP), gas currents (I gas-up, I gas-down), gas voltages (V gas-up, V gas-down), charge current, and charge voltage (CMV) are initialized.

Determination of the true open circuit voltage of the battery is the first step in the method shown in FIG. 2. The voltage measured across the terminals of battery 40 when no current is passed to or from battery 40 is normally known in the art as the open circuit voltage (OCV) of the battery. Soon after a lead-acid battery is discharged or charged, the voltage measured across the battery terminals changes even though the battery is in open circuit, due to the non-uniformity of the electrolyte concentration in the pores of the electrodes and the bulk, normally known as the concentration polarization. The polarization decreases with time due to diffusion and convection of the electrolyte between the bulk and the electrode pores and hence the voltage between the terminals approaches a constant value reflecting its state of charge which is a measure of the available energy in the battery in terms of its total capacity.

Charger 80 determines the true open circuit voltage (OCV) by measuring the battery terminal voltage in open circuit repeatedly for a predetermined period as for example, 1 to about 10 minutes, at a convenient interval as for example (1 to about 10 seconds) and extrapolating to a long interval as for example, 2 to about 4 hours. The measured battery voltage (V) varies with log time (log t) linearly. The mathematical equation for this straight line relationship between V and log t (V=m logt+c, where m is the slope and c is intercept) is determined using the data measured for a few minutes as mentioned above. It is obvious that the open circuit voltage after complete depolarization is obtained by inserting a generally accepted time for relaxation (2 or more hours) in the said equation and evaluating V. Various characteristics of the battery can be determined from the true open circuit voltage. For example, the state of charge (SOC) of lead-acid batteries can be determined from the open circuit voltage. The open circuit voltage of a battery increases linearly as its state of charge increases from 0 to 100%.

For example, the open circuit voltage of lead-acid cell varies linearly from 2 to 2.2 V as its state of charge increases from 0 to 100%. The state of charge (SOC) can be determined from open circuit voltage several times during the course of charge process using the equation:

$$SOC = ((OCV/NOC) - 2.0) \times 100/0.20 \qquad (1)$$

This equation is based on the OCV excluding the electrode concentration polarizations. However, the measured OCV invariably includes electrode polarization. The true OCV can be obtained by using different values for the denominator to account for the polarization at the time of OCV measurement. For example, when the OCV measurement is made 5-10 minutes after placing the battery in open circuit the denominator 0.26 can be substituted for 0.20. Thus, the following equation may be used in this case.

$$SOC = ((OCV/NOC - 2.0) \times 100/0.26) \qquad (2)$$

Usually, since the battery is relaxed between the time of use and the start of charging time to determine the initial OCV measurement equation 1 may be used. This is not true in other mid-test cycles during the course of charging and equations such as the equation 2 can be used. The voltage due to concentration polarization can be eliminated by letting the electrode equilibrate with the bulk electrolyte for a few hours. Since it is not practical to wait such a long period, especially when most of the depolarization occurs in the first few minutes, a 5 to about 10 minute waiting period and the equation with larger denominator of 0.26 can be used to take care of the remaining polarizations. The preferred method for determining the state of charge is the method based on the battery voltage and log t using equation (1) as described earlier.

Having determined the OCV of the battery 40, microprocessor 10 evaluates battery 40 for some possible defect conditions. The operator is warned by an alarm or flash for appropriate action, if any fault condition requiring the operator's attention is found. Several fault conditions of battery 40 can be detected using the method and this testing apparatus. If the measured OCV is less than −1 V, it indicates that battery to charger connections are reversed If the OCV is between +1 and −1 V, no battery 40 is connected to the charger 80 or the connections are very poor. If the OCV is more than +1 V, but no current flows when the current or voltage supplied to battery 40 by power unit 30 is increased, it is indicative of high resistance in the circuit This may arise from any of the following factors including bad connections, corroded terminals, loss of electrolyte, bad relay connections in the tester/charger and very heavily sulfated cells.

In the next step of the method of FIG. 2, the OCV is fed into microprocessor 10 which then determines the minimum (Minicell) and maximum (Maxicell) number of cells possible for the OCV of battery 40, and thus fixes the range of the number of cells in battery 40. Microprocessor 10 is programmed such that the upper and lower limits of the number of cells are calculated from the open circuit voltage (OCV) using the formula $$Maxicell = (OCV/m) \qquad (3)$$

$$Maxicell = (OCV/P) \qquad (4)$$

wherein the constants p and m are characteristics of the type of battery, and correspond to the cell voltage of a completely charged cell and the cell voltage of a completely discharged cell, respectively. In the case of the preferred lead-acid battery, m is equal to 2.0 and p is equal to 2.2. In the practice of the preferred embodiments of this invention where battery 40 is a lead-acid battery, if the maximum number of cells is determined to be less than or equal to eight, then the minimum and true number of cells are set equal to the maximum number of cells.

The maximum number of cells is normally calculated only at the beginning, prior to battery charging/testing. This value generally represents the correct cell number if the initial state of charge is less than about 30%. This value is the upper limit in any case. The minimum number of cells is calculated each time when the OCV is measured just before a ramping sequence described below. This usually represents the correct cell number if the state of charge is greater than about 75%. Thus, even if the initial state of charge is low, as the battery gets fully charged, the minimum number of cells converges to the correct value. It represents the lower limit, and this limit increases as the battery is charged to full capacity.

Charger 80 assumes that the number of cells in the battery is equal to the minimum number of cells and supplies a controllably varying charging current or voltage to the battery for a predetermined period of time, and tests the battery for the evolution of gas to determine the gas point. This procedure is described throughout the specification as ramping.

Several pertinent pieces of information can be determined from the gas point, which are useful in charging the battery. For example, during the charging process, how high a current a battery can accept without evolving gas depends on its capacity and SOC. For a battery of given capacity, the threshold current at which the battery starts evolving gas decreases with increase in SOC.

The voltage at the gas point (Vgas) is used to determine the number of cells in the battery using the formula:

$$Number\ of\ cells = Vgas/n \qquad (5)$$

The denominator n depends on charger 80, the type of battery and the rate of change in the applied parameter (current or voltage). In the case of lead-acid batteries, n is in the range 2.35–2.60V, and is usually 2.50V. The gas current in the increasing direction (Igas-up), when the battery is fully charged is characteristic of the battery capacity, and can be used to determine the same. The gas current in the decreasing direction, Igas-down, reaches the lowest possible value for a given charger 80, battery 40 and slope of the ramp, and is used to denote the end of charge. The difference in the gas current of either direction (Igas-up—Igas-down), is also useful to determine the approximate battery capacity at any state of charge.

Aside from the above method based on Igas-up, an alternate method based on the amount of charge the battery has accepted ($\Delta C$) and the corresponding increase in its state of charge ($\Delta SOC$), can be used to determine the battery Capacity (C) according to $C = \Delta C \times 100/\Delta SOC$).

The battery capacity can also be determined from dV/dt of step 1 of the charge curve. For a given constant charge current, dV/dt is inversely proportional to the capacity. In this method, dV/dt is measured for a given constant charge current in step (g). The corresponding charge rate is determined from a previously collected data and dV/dt is measured at various charge rates which data is stored in the memory of microprocessor 10. The current times the charge rate is equal to the battery capacity. Alternate methods for determining the battery capacity involve the calculation of C in the ramp cycle from the maximum in dV/dI, or from the minimum in dI/dV at 100% SOC, or from the depolarization curve (V-t) at 100% SOC.

Microprocessor 10 can be programmed to determine the battery capacity by any of these methods. However, the Igas-up method of determining the capacity of the battery is preferred.

Figure 3:
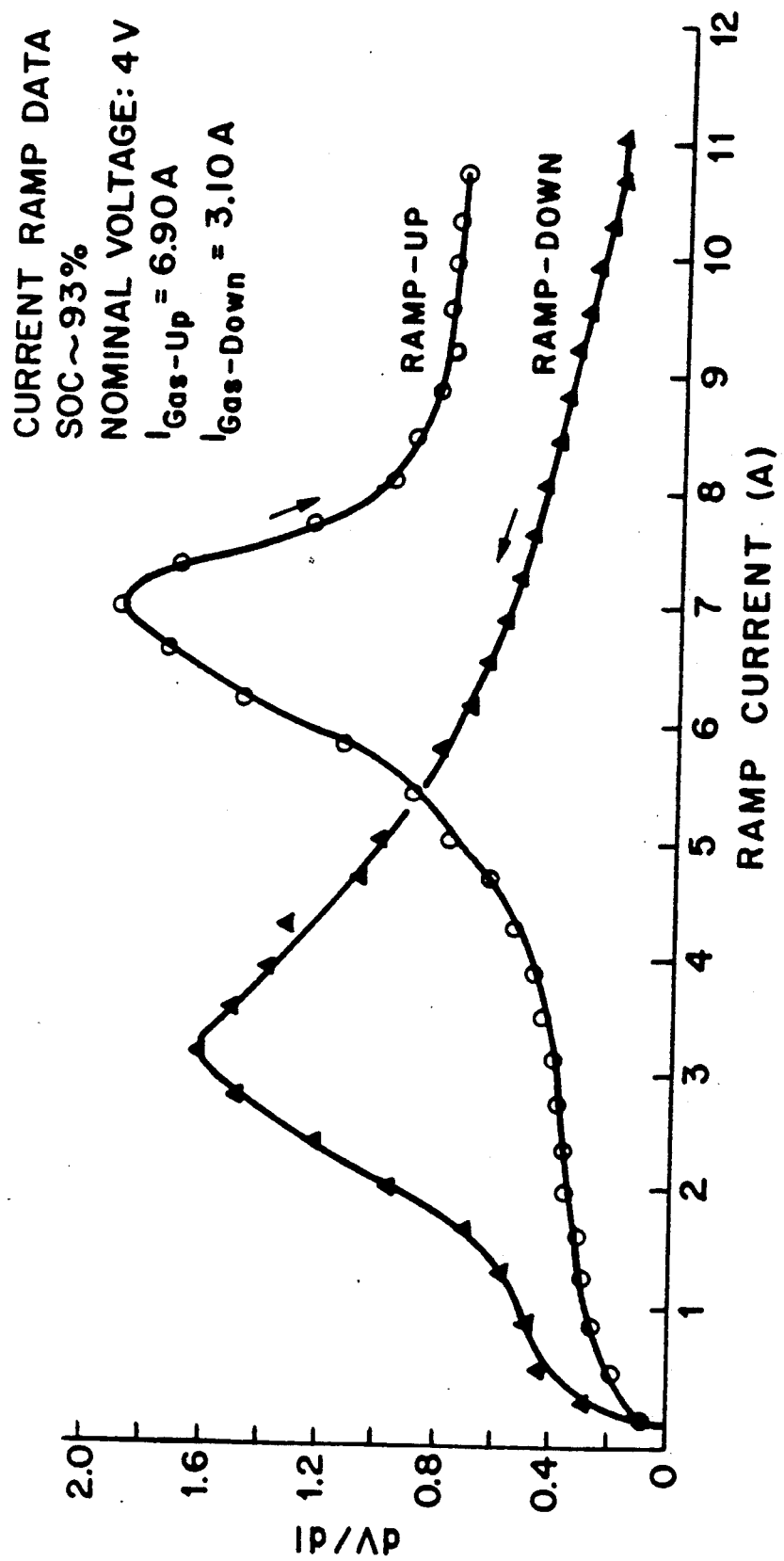
FIG. 3 is a plot of $dV/dI$ versus the ramp current using a current ramp with a battery at 93% state of charge.
Figure 4:
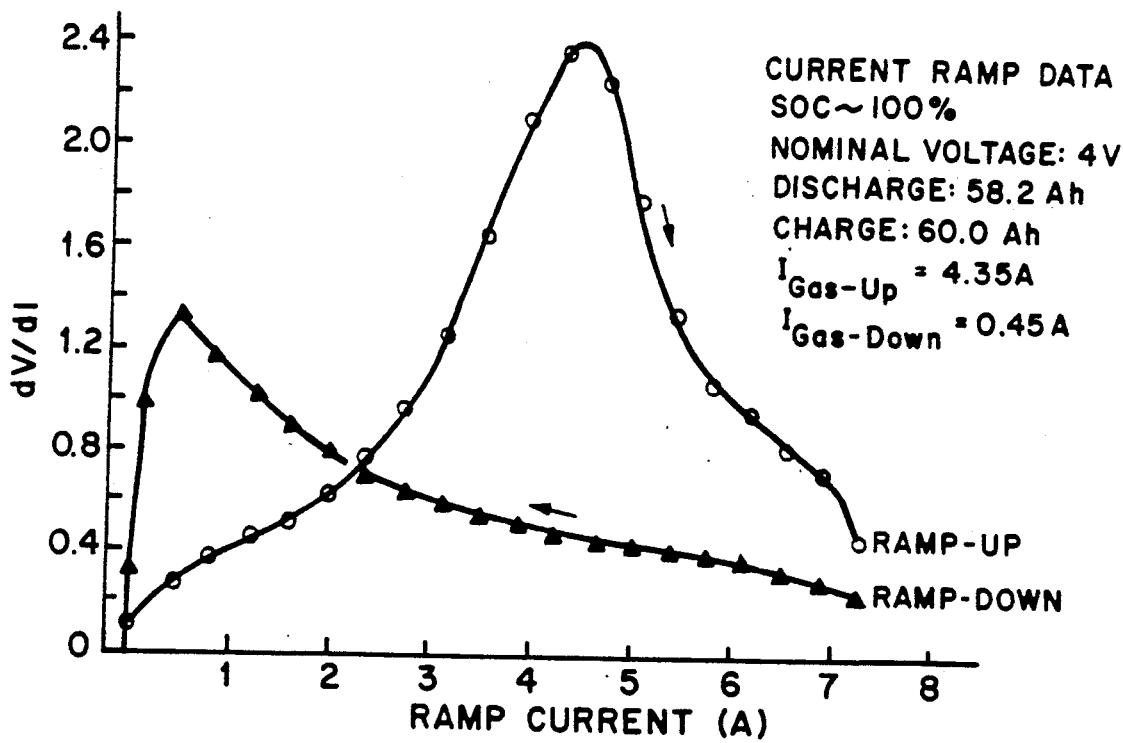
FIG. 4 is a plot of $dV/dI$ versus the ramp current using a ramp current with a battery at 100% state of charge.
Figure 5:
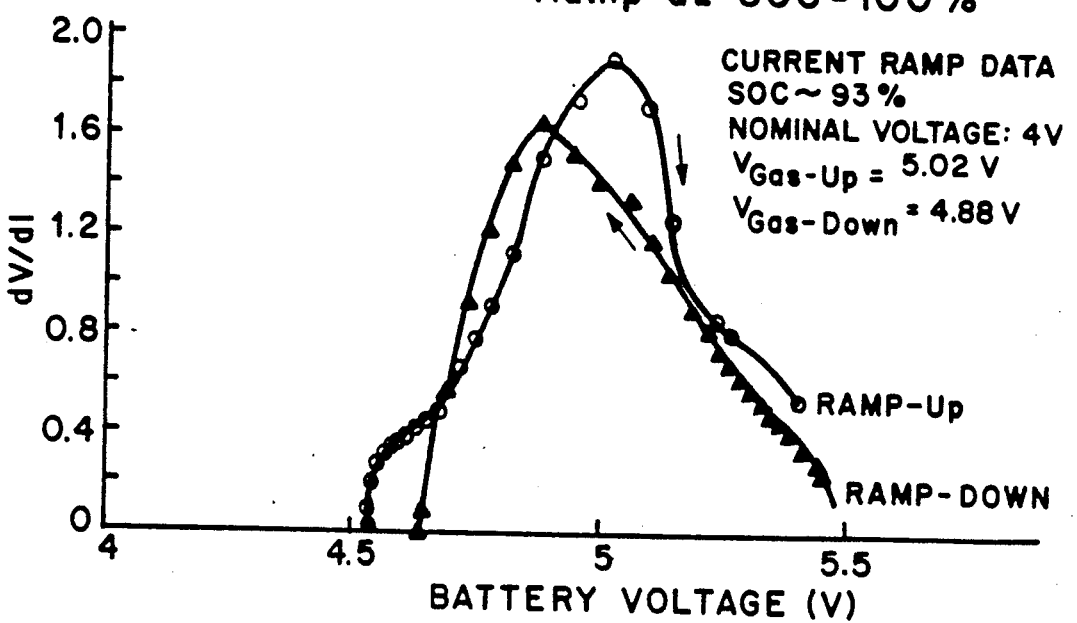
FIG. 5 is a plot of $dV/dI$ versus battery voltage using a current ramp with a battery at 93% state of charge.

Any method of determination of the gas point and the various parameters attended thereto can be used in the method of this invention. In the preferred embodiment of the invention, three methods may be used to determine the voltage and current at the threshold level called the gas point. One useful method is to ramp the current up to a maximum value and then down to zero. Typically, when the current ramping method is used, the current signal is linearly increased from 0 to a predetermined value over a predetermined period of time. The current is maintained at the predetermined level for a predetermined period and then decreased to 0 over another predetermined period of time, which is usually the same period of time over which the current is increased. It is appreciated that predetermined upper limit of the ramping current and the ramping time is dependent upon the output capability of power unit 30, response times of microprocessor 10 and power unit 30, and the capacity of battery 40. For example, typically when the current ramping method is used with lead-acid batteries the current signal consists of an increasing ramp from 0 to about 20A, over a period of about 20 to about 60 seconds, the current is held constant at this level for about 0 A in 20–60 seconds. During the ramp, the voltage response of the battery is measured. A plot of dV/dI vs. Iramp, dV/dI vs t, (the ramp time), exhibits a maximum corresponding to the gas point as shown in FIG. 3. The gas point appears at a higher value of current in the increasing ramp direction compared with that in the decreasing direction. However, Vgas, the voltage at the gas point remains about the same in either directions. FIGS. 3 and 4 show dV/dI vs Iramp plots for the same battery at two different states of charge (93 and 100%). It is noteworthy that the peaks move to lower values of current as SOC increases. At 100% SOC (FIG. 4), the Igas-down has reached the lowest possible (set) value, while the Igas-up remains at a higher value. The latter is useful in calculating the battery capacity as discussed before under the significance of gas point. FIGS. 5 and 6 exhibit the corresponding dV/dI vs V response data. It is important to note that the voltage where a maximum occurs does not change appreciably with SOC, and that it is characteristic of the number of cells in the battery.

Figure 8:
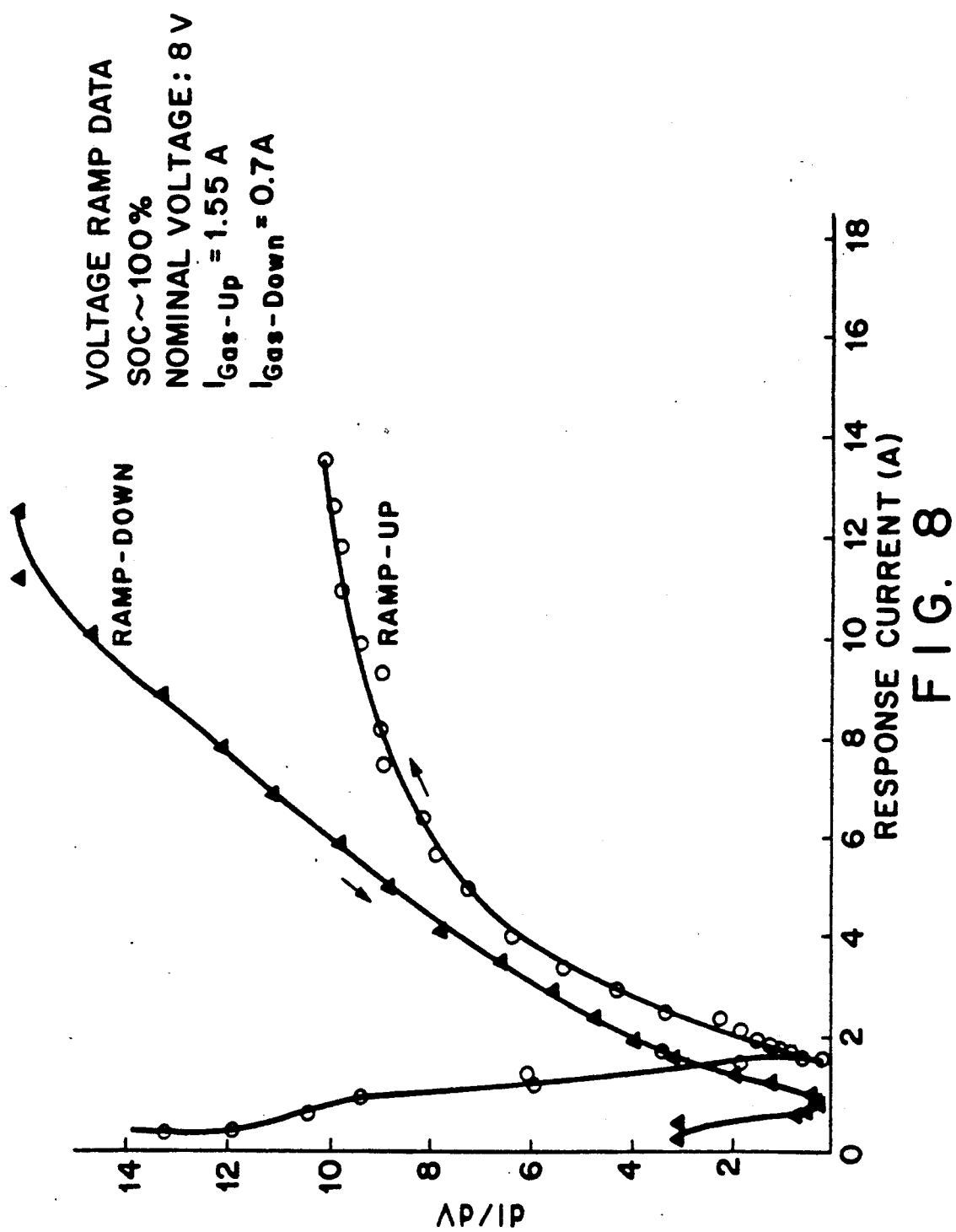
FIG. 8 is a plot of dI/dV versus battery current using a voltage ramp with a battery at 100% state of charge.

Another method used to determine the voltage and current at the threshold level called the gas point is the voltage ramping method. When the voltage ramping method is used, the signal consists of a continuous or discrete increasing voltage ramp from the OCV to a predetermined end voltage usually a voltage corresponding to about 0.4 to about 0.6 V higher than the OCV for each cell. During the voltage ramp, the current response of the battery is measured. A plot of dI/dV vs Vramp, Iresponse or ramp time exhibits a minimum corresponding to the gas point. The presence of multiple minima in any direction indicates the presence of mismatched cells in the battery. FIGS. 7 and 8 show dI/dV vs. Iresponse data for the same battery at different states of charge (50 and 100%). The Igas and Vgas parameters have the same significance as in the previous current ramp method. In the case of both the current ramping method and the voltage ramping method, the increasing signal changes over to the holding portion earlier than the time limit, 60 seconds, whenever the voltage limit (2.5–2.8 V/Cell for lead-acid batteries) is reached. It is appreciated that this situation would be encountered when the battery capacity is low and/or its state of charge is high.

The presence of a maximum in dV/dI versus Iramp or a minimum in dI/dV versus Vramp indicates the gas point. In the increasing ramp direction, the battery starts evolving gas at the gas point, and in the decreasing ramp direction the battery stops evolving gas at the gas point. From the voltage at the gas point, the true number of cells (NOC), is calculated using the formula:

$$NOC = Vgas/n \qquad (6)$$

wherein n is a value which is characteristic of the type of battery. The denominator is the cell voltage at which gas evolution starts in the dynamic conditions of the ramp, and is dependent upon the type of battery and slope of the ramp, and falls generally in the range from about 2.35 to about 2.65 V/cell for lead-acid cells. The cell voltage at which gas evolution occurs in other types of secondary batteries will differ which will necessitate a change in the denominator.

Figure 9:
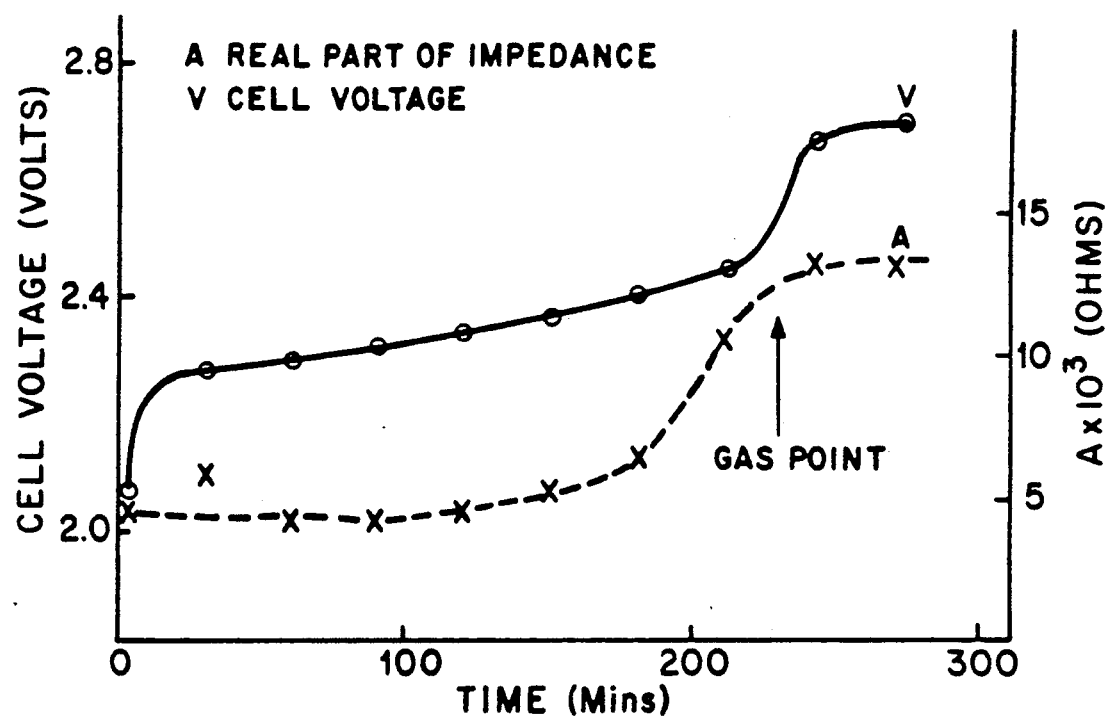
FIG. 9 is a plot, which shows the variation of cell voltage and impedance as a function of charge time during a constant current charge.

Another method of determining the gas point is by impedance. When a battery is charged under constant current, the variation of battery voltage and impedance with the charge time is shown in FIG. 9. The similarity between the two curves, especially the sharp increase in both parameters at the gas point, suggests that the gas point may be detected by measuring the impedance, particularly its real part, while ramping the current or applied voltage. Thus, a method based on ramping current or voltage and measuring the battery impedance (Z), and voltage or current can also be used to detect the gas point. In this method, an ac signal whose frequency is equal to or less than 1 Hz is used to reasure the impendance of the battery. A plot of $dZ/dI$ vs. I, V or t has characteristics very similar to that of $dV/dI$ vs. the corresponding parameter. For example, a plot of $dZ/dI$ vs. I is similar to FIGS. 3 and 4. Likewise, Igas and Vgas are obtained from the parameters at the maximum point.

A number of defects of the battery can be determined from the gas point characteristics. If two or more peaks are observed on the increase in voltage or current (ramp up direction) along with the presence of at least one peak in the decreasing direction (ramp down), then battery 40 has cells mismatched in capacity. The observations of one or more peaks in the ramp up direction, coupled with their absence in the ramp down direction, indicates that battery 40 (if a lead-acid battery) is sulfated. If the internal resistance as determined is higher than a set limit, the charger/tester activates a warning signal. The presence of a soft-short circuited cell is indicated if mismatched cells are found with one or more cells having very low capacity (a disproportionately low value for one of the Igas-up parameters) or if a jump of at least 1.5 V in open circuit voltage occurs due to ramping (OCVs before and after ramp differ by 1.5 V or more).

When a high voltage battery having many cells in series is charged possibly at high current, the voltage drop due to internal resistance of the battery can be substantial. In such cases, it is important to estimate the internal resistance. Vgas is characteristic of the number of cells in the battery, and should be constant irrespective of SOC and capacity. In practice, Vgas varies to some extent at high values of Igas, which is due to the internal resistance. The charger and method of this invention can thus determine the battery's internal resistance (R) from two ramp cycles as follows:

$$R = (Vgas\text{-}up1 - Vgas\text{-}up2)/(Igas\text{-}up1 - Igas\text{-}up2) \quad (7)$$

If the current or voltage ramp test indicates the r presence of a gas point then battery 40 is charged under constant current charge conditions preferably at a current that is equal to the maximum current that power unit 30 can deliver (or according to the battery capacity) subject to a high voltage limit set at Vgas. During this constant current charge period the battery voltage increases and reaches Vgas at which time the battery is charged in accordance with constant voltage charge mode.

If the ramp does not indicate the presence of a gas point, the number of cells is assumed to be equal to a new minimum number of cells calculated in using the new OCV and equation 4 and the battery is charged under constant pre-determined current, usually equal to the maximum current that power supply 30 can deliver (or according to the battery capacity) until the battery voltage reaches a value equal to the minimum estimated number of cells multiplied by 2.5. Then it is subjected to the ramp to determine the gas point. This procedure is repeated until ramping indicates gas evolution.

Figure 10:
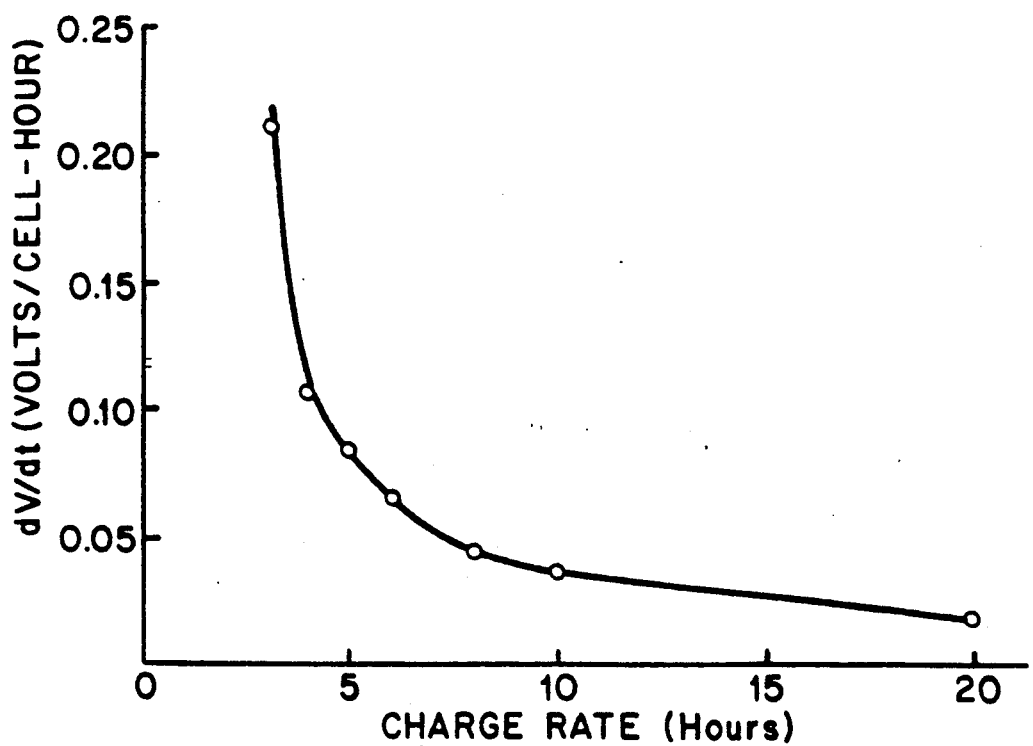
FIG. 10 is a plot which shows the dependency of the rate of change of battery voltage on the charge rate.

If the maximum charge current is desired to be based on the battery capacity or at a specific charge rate (e.g. 5 or 6 hour rate), it can be implemented using the $dV/dt$ of the charge curve. The relationship between the rate of change of battery voltage and the charge rate is shown in FIG. 10. The battery is charged at a predetermined rate, which can be any desired rate, by making charger 80 adjust the charge current continuously such that $dV/dt$ is maintained at the corresponding value given by the data in FIG. 7. Processor 10 automatically determines the level of the charge current depending on the desired charge rate set by the operator. If the operator has not selected a charge rate, processor 10 assumes the default value of 6 hour charge rate. The relationship between the charge rate and the rate of increase of a lead-acid cell voltage, when no gas is evolved, is shown in FIG. 10. The data of this figure is stored in memory. Processor 10 adjusts the charge current such that the rate of change of the battery voltage conforms to the value found in the said data in memory corresponding to the selected charge rate.

During this constant current charge period, the battery voltage increases and reaches the said limit value. Since processor 10 does not let the charge voltage rise beyond the said limit, the charge current decreases. When the said current falls to a predetermined percentage of the constant charge current, the microprocessor 10 opens the charging circuit. Battery 40 is kept in open circuit for a predetermined period as for example to about 10 minutes. The true open circuit voltage and the minimum number of cells (MINCEL) are determined as described above. The number of cells is made equal to the new MINCEL value. It is appreciated that the said new MINCEL value may be larger than the previous MINCEL value if the state of charge of the battery has changed substantially and the previous MINCEL value is lower than the true number of cells.

After the open circuit period, microprocessor 10 performs another ramp cycle (step b) and checks for the presence of gas point and battery defects. This sequence of charging until the charge current becomes limited by voltage limit and subjecting the battery to a ramp cycle is repeated until the presence of a gas point is detected in a ramp cycle. The correctness of the number of cells is confirmed from the gas point in the ramp cycle. It is appreciated by those familiar in the art that one or more of the ramp cycles may be skipped, if desired, since the charge process is controlled primarily by the MINCEL parameter which is determined from the new OCV and not necessarily from the ramp cycle.

It is further appreciated that the values of MINCEL and NOC tends to increase and reach, but never exceed the value of true number of cells, especially when the initial state of charge of the battery is low. After the detection of the gas point, the true number of cells is calculated, and thereafter, if required, the battery is charged at a constant pre-determined current until the battery voltage reaches Vgas.

In the next step of this method, the battery charging continues in the constant voltage charging mode with the voltage set at NOC times some value which is characteristic of the type of battery. With lead-acid batteries this value is from about 2.35 to about 2.6 V, preferably 2.5 V/cell. This charging at constant voltage is continued until the charge current falls to a predetermined low limit, for example 0.5-1A. During this step of the method, the charge current is allowed only to decrease. Processor 10 does not permit the current to increase even if it requires a decrease in the charge voltage.

Figure 11:
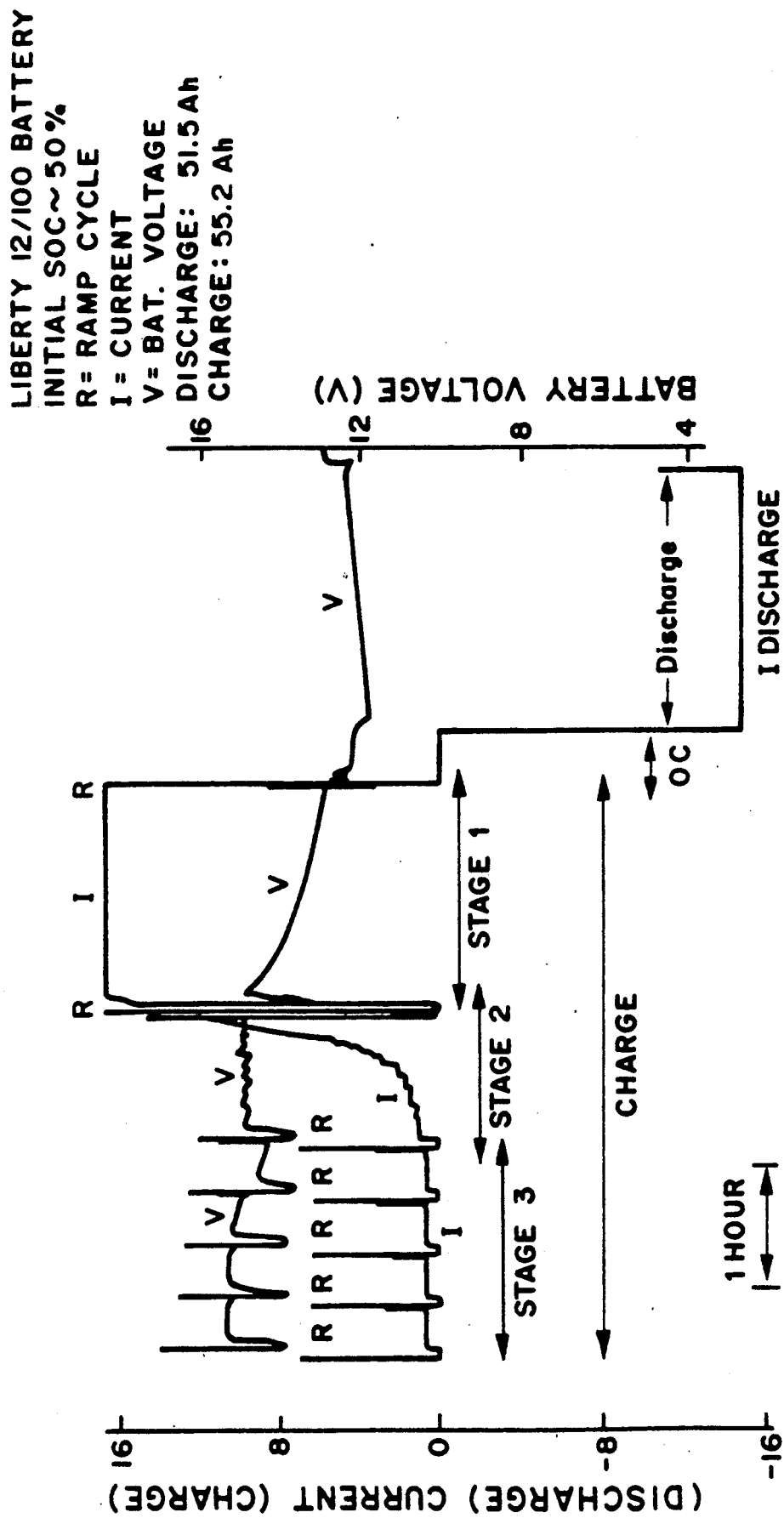
FIG. 11 is a charge profile of a lead-acid battery whose initial SOC was 50% charged with the battery charger of this invention in accordance with the embodiment of FIG. 2.

At this time, microprocessor 10 starts charging the battery under the low limit constant current mode letting the voltage go higher than the said limit for a predetermined period of time. The battery is subjected to the ramp cycle after a predetermined period of time as for example, 30 minutes in stage 3 and again at predetermined periodic intervals, for example 20-50 minutes. The battery is then charged at constant current (preset low limit) until at least one of the following conditions are satisfied: (a) The charging current is above zero but equal to or lower than the preset low limit (b) I gas-down reaches a predetermined value characteristic of the charger system and slope of the ramp; or the difference between two successive I gas-down or I gas-up values becomes less than or equal to a set limit, for example 1 mA. The charge profile is shown in FIG. 11 for a battery whose initial SOC was 50%.

Finally, the end of charge message, the capacity calculated from the gas evolving current, I gas-up, and the nominal battery voltage are displayed.

Figure 12:
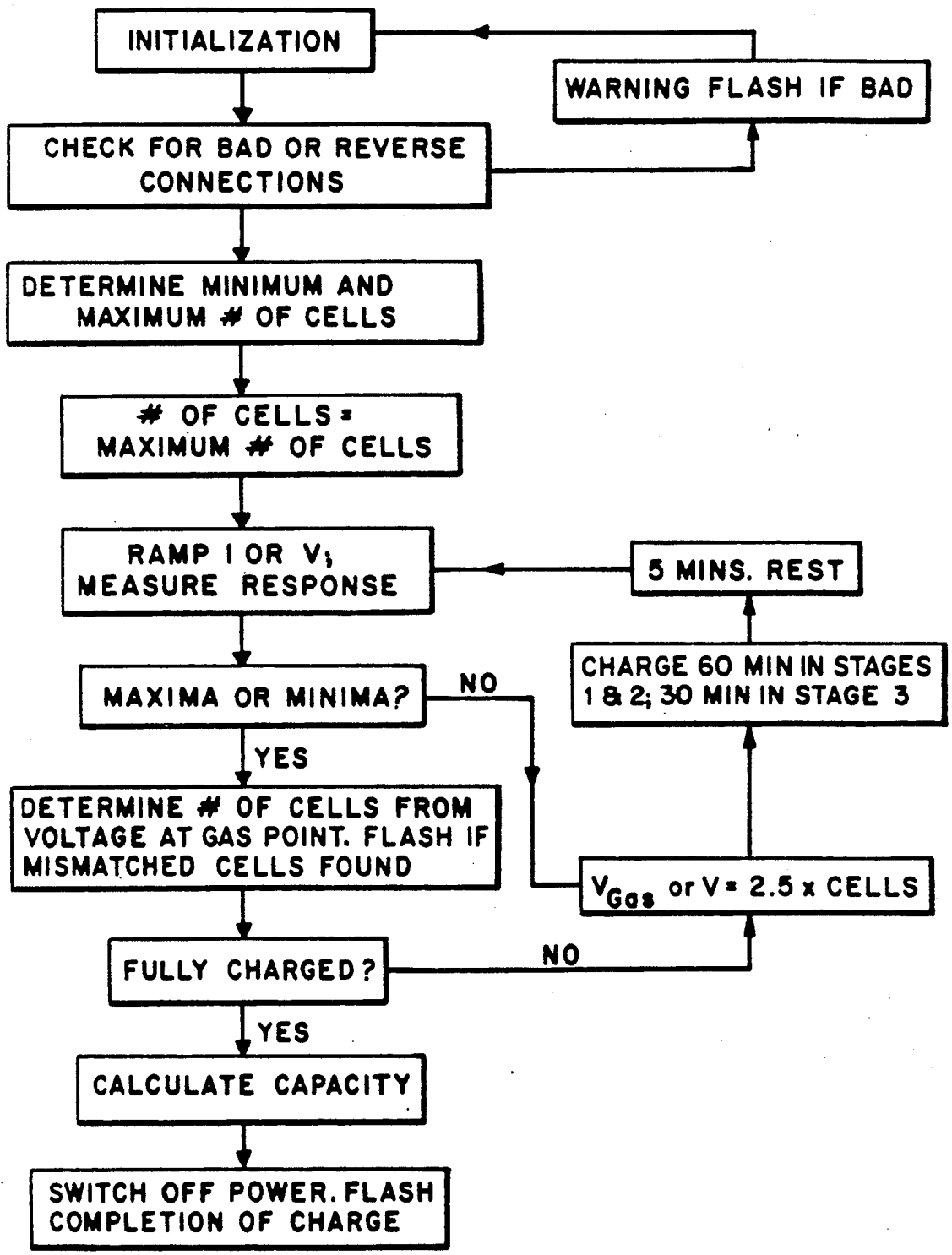
FIG. 12 is a flow diagram of a preferred embodiment of this invention.

Another method of this invention is depicted in FIG. 12. In this embodiment, the number of cells is initially set equal to the maximum number of cells (MAXCEL). If the initial state of charge of the battery is low, MAXCEL may actually be equal to the true number of cells. If the initial state of charge of the battery is high, MAXCEL may be greater than the true number of cells. It is appreciated that MAXCEL is never lower than the true number of cells in the battery. MAXCEL is determined only at the beginning of the charge process.

Figure 13:
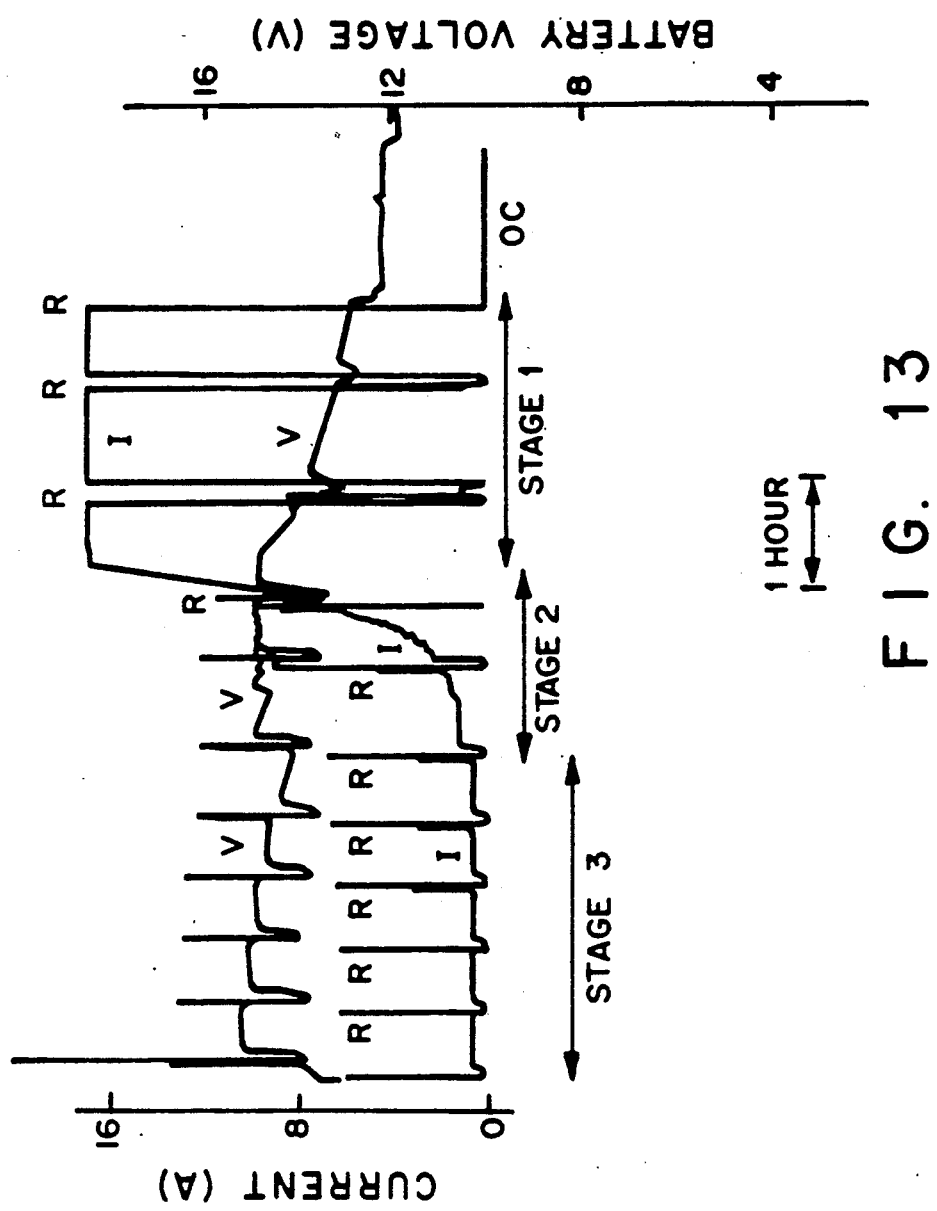
FIG. 13 is a charge profile of a lead-acid battery, whose initial SOC was 50%, charged with the battery charger of this invention in accordance with the embodiment of FIG. 12.

A flow chart of this method is shown in FIG. 12. When battery 40 is connected to charger 80 and started, variables as for example number cells(NOC), state of charge (SOC), maximum (MAXCEL) and minimum (MINCEL) number of cells, battery capacity (CELCAP), gas currents (Igas-up, Igas-down) and voltages (Vgas-up, Vgas-down), charge current and voltage (CMV) are initialized. Charger 80 measures the open circuit voltage (OCV) of battery 40. Some faulty conditions like reverse, bad or no connections are detected, and the user is warned by an alarm or a flash. Charger 80 determines at least the maximum number of cells possible for the measured OCV. Charger 80 assumes the number of cells to be the maximum and goes through a ramp cycle. The voltage limit for the ramp cycle is set at some voltage which is characteristic of the battery. For example, in a lead-acid battery, the voltage limit is preferably 2.6-2.8 V times the MINCEL. In the ramp cycle, either current ramping method or voltage ramping method, as described earlier, is employed and the gas points are determined. From the voltage at the gas point, the number of cells (NOC), is calculated using the formula:

$$NOC = Vgas/n \qquad (8)$$

wherein n is a constant which is characteristic of the particular battery being charged. For example, with lead-acid batteries, n is 2.50V. In the absence of a gas point in the ramp cycle, the assumed value of NOC continues to be in effect until the actual value is determined from a succeeding ramp cycle. The battery is then charged for a predetermined interval e.g. 20 to 60 minutes at the maximum permissible constant current subject to a high voltage limit at Vgas, or $V = n \times NOC$. The charging cycle interval may be varied depending on the state of charges (SOC). For example, the higher the state of charge, the shorter the charge interval, and conversely, the lower the state of charge, the longer the charge interval. The battery is placed in open circuit for a predetermined period of time, e.g. 1 to 10 minutes after which another ramping cycle starts. As an alternative to this long open circuit period, voltage-time data collected for a very short period, typically a minute or less, can be extrapolated to determine the OCV at infinite time as shown in FIG. 3. This sequence of charging and ramping is repeated until the end of charge. However, when the above voltage limit is reached, the charge process continues at constant voltage until the current falls to a preset low limit e.g. 0.8A. Then the battery is charged at this low constant current letting the voltage float. The end of charge is detected as described earlier. Battery capacity calculated from the Igas-up, the nominal battery voltage, and completion of charge are displayed. A typical charge profile which was charged with the charger of this invention in accordance with the embodiment depicted in FIG. 12 and whose initial SOC was 50% is shown in FIG. 13.

One advantage of the method and apparatus of this invention is that the battery undergoes test cycles only a few times during the entire charge process, even if the initial state of charge is near zero. This may lead to shorter charge times. In the above methods, the open circuit periods help reduce polarization, and as a result the battery experiences less severe charging conditions leading to high charger efficiencies. In addition, since the method and tester of this invention can detect faulty conditions of the battery, they can be used as quality control instrument in battery manufacturing plants, functioning as a battery tester. This embodiment of the invention can also be adapted to function as a battery burn-in apparatus (cycles the battery a few times before shipping to retailers) in battery manufacturing companies.

The following specific examples are presented to more particularly illustrate the invention and are not to be construed as limitations thereon.

EXAMPLE I

Voltage Ramping

Figure 14:
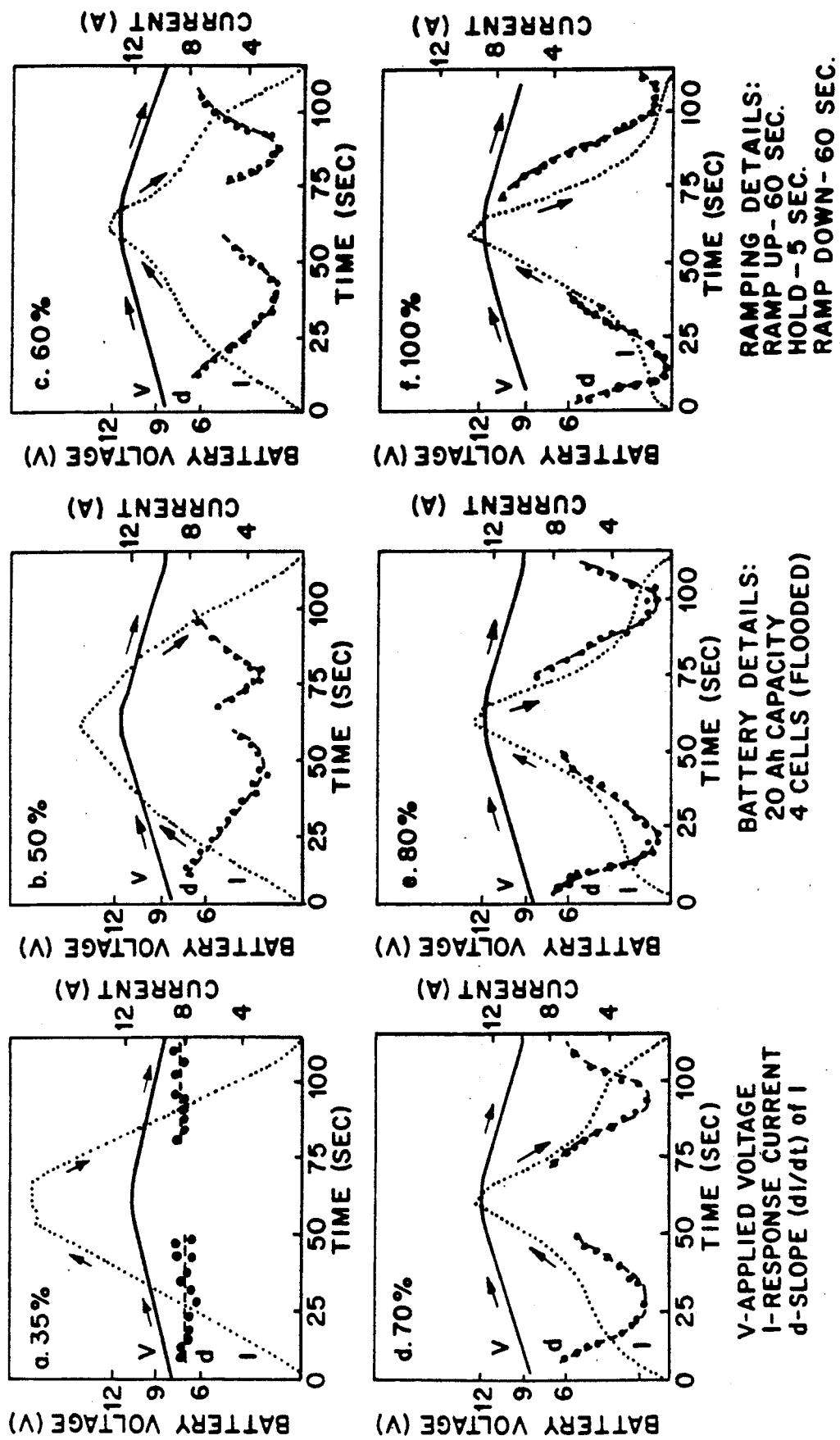
FIG. 14 is a series of plots determining gas point by a voltage ramp method.

Attention is directed to FIG. 14 which shows a variation of the applied voltage signal, the current response and the differential, dI/dt, with time, t, of a 4-cell 20 Ah battery at different states of charge. At the gas point, the current lags the voltage and consequently the differential exhibits a minimum. Igas-up and Vgas-up refer to the current and voltage at the gas (minimum) point in the ramp-up direction, while Igas-down and Vgas-down refer to the corresponding parameters in the ramp-down direction. A plot of the Igas-down versus the state of charge leads to the gas curve. The gas curve indicates the maximum current the battery can accept without evolving gas. Therefore, the battery charging can be accomplished in the shortest possible time and most efficiently by making the charge current follow the gas curve as closely as possible. The method of this invention accomplishes this when a charge voltage limit for stage 1 and the constant charge voltage for stage 2 are chosen in the range of 2.35 to 2.60 V per cell, particularly around 2.48 V per cell. (See FIG. 13).

EXAMPLE II

Current Ramping

Figure 15:
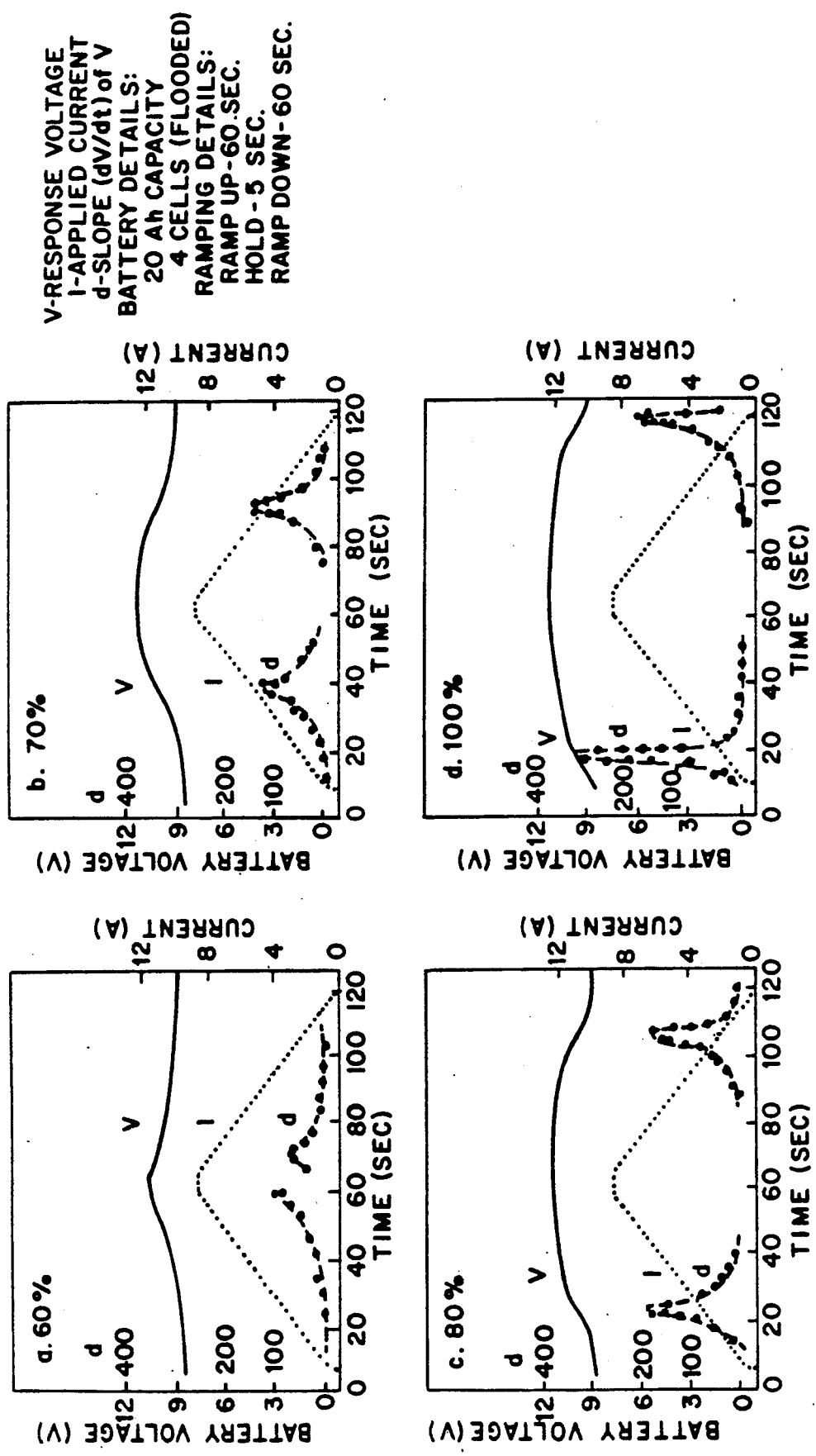
FIG. 15 is a series of plots showing the detection of the gas point by a current ramping method.

Attention is directed to FIG. 15, which shows variation of the applied current signal, the voltage response and the differential dV/dt with time, t, of the same 4-cell 20 Ah battery as in Example I (FIG. 14), at different states of charge. At the gas point, the voltage signal increase before the current signal and consequently, the differential exhibits a maximum. The Igas-up, Igas-down, Vgas-up and Vgas-down obtained from FIG. 15 are comparable to the corresponding parameters in FIG. 14 (Table 1).

TABLE 1

| | Gas point parameters by current and voltage ramping methods. | | | |
|---|---|---|---|---|
| | Soc | I gasup | I gasdown | V gasup | V gasdown |
| I ramp | 100 | 2.06 | 0.48 | 10.30 | 10.07 |
| | 80 | 3.33 | 2.22 | 10.23 | 10.21 |
| | 70 | 5.24 | 4.45 | 10.30 | 10.39 |
| | 60 | 8.10 | 7.79 | 10.48 | 10.63 |
| V ramp | 100 | 1.68 | 0.63 | 9.79 | 10.06 |
| | 80 | 3.39 | 2.43 | 10.01 | 10.39 |
| | 70 | 5.79 | 4.58 | 10.53 | 10.52 |
| | 60 | 9.15 | 8.15 | 10.90 | 10.95 |
| | 50 | 13.16 | 12.18 | 11.03 | 11.09 |

EXAMPLE III

Charging with different initial SOC

A 20 Ah battery was discharged to various known depths, and then recharged with the apparatus of this invention. The charge output from the battery during discharge, the corresponding state of charge, the subsequent charge input to the battery during the charge process, and the percent of the charge wasted are shown in TABLE 2.

TABLE 2

| | Charge Details at different initial states of charge. | | |
|---|---|---|---|
| Discharge (Ah) | Charge (Ah) | Initial Soc (%) | % Wast* (of charge) |
| 19.75 | 20.20 | 0 | 1.0 |
| 15.87 | 16.70 | 24 | 4.9 |
| 11.21 | 11.60 | 44 | 3.4 |
| 8.07 | 8.90 | 60 | 9.4 |
| 3.38 | 4.03 | 83 | 16.0 |
| 0 | 0.36 | 100 | 100.00 |

EXAMPLE IV

Testing Different Type Of Batteries

Lead-acid batteries of flooded type (excess electrolyte with capacities of 20 Ah and 5o Ah, a sealed (starved) lead-acid battery of 100 Ah, a SLI battery of 34 Ah, and a motorcycle battery of 5.5 Ah were discharged to known depths. They were recharged successfully with the charger of this invention. Possible defects like soft-shorted cells in the motorcycle battery were indicated by the charger.

EXAMPLE V

Mismatched Cells

A 10 Ah and a 12 Ah batteries were connected in series and charged with the charger/tester of this invention. Mismatched cells were indicated. In another instance 14-cells of 20 Ah and a 1-cell 50 Ah battery were connected in series and charged as one battery. The charger/tester indicated the presence of mismatched cells.

EXAMPLE VI

Sulfated Cells

A 20 Ah battery was discharged to the low cut-off limit of 1.75 V/cell, and left in open circuit for 3 days. After this period when charged with said charger, the message, "Presence of sulfated cells" was indicated by the charger, yet the battery was charged successfully. The same procedure was repeated with an open circuit period of 8 days after discharge with the same result.

EXAMPLE VII

Soft-shorted Cells

The presence of soft-shorted cells is one of the common failure modes of lead acid battery. Generally the shorted cell behaves like a normal cell with low capacity during charge, but becomes a dead cell (loses voltage) during discharge and in long open circuit periods. The time when the cell gets activated during charge is unpredictable. To some extent, this time of activation depends on how hard the short is and the state of charge.

Our test on this aspect were carried out using a 5 Ah 6 V motor cycle battery. Experiments were done at various initial SOC. At high initial SOC, the soft-shorted cell became active during the first test (ramp) cycle. With he lower initial SOC, the cell got activated only during the charge cycle. Nevertheless, the charger detected and signaled the presence of the soft-shorted cell.

EXAMPLE VIII

No Connection

The charger was started without connecting any battery. The result was the message by the computer, "No battery connected".

EXAMPLE IX

High Resistance

During the series of experiments, the relay contacts developed a highly resistive film. This was indicated by the charger. Also when the terminals are highly corroded and connected to the charger without cleaning them, the high resistance is noted. In both instances the following message was flashed by the computer.

"Check water in battery"
"Check relay contacts"
"Check terminal connections"

EXAMPLE X

Reverse Connections

The positive terminal of the battery was connected to the negative in the charger, and the negative terminal of the battery to the positive of the charger. The charger warned of reverse connections.

What is claimed is:

1. A method of charging and testing a rechargeable battery which comprises the steps of:
    (a) measuring the open circuit voltage of said battery and estimating the number of cells possible for the measured open circuit voltage;
    (b) supplying a controllably varying charging current or voltage to the battery for a predetermined period of time while measuring the response voltage or current produced at or through the battery terminals and testing said battery for the evolution of gas;

(c) charging said battery automatically with a charge input at any charge rate until the battery charge voltage equals the estimated number of cells of the battery multiplied by a predetermined voltage which is characteristic of the battery;

(d) repeating steps (a), (b), and (c) until step (b) indicates the evolution of gas;

(e) determining the current ("Igas-up") and voltage ("Vgas-up") at which said battery evolves gas in the increasing current direction, and the current ("Igas-down") and voltage ("Vgas-down") at which the battery stops evolving gas in the decreasing current direction;

(f) determining the true number of cells in said battery from said Vgas-up and/or said Vgas-down;

(g) determining the state of charge using the true number of cells determined in step (f), the open circuit voltage measured in step (a) and the charge input to said battery by the apparatus;

(h) determining the capacity of said battery from said Igas-up when said Igas-down is lower than or equal to a predetermined value, or from the difference in said Igas-up and Igas-down when said Igas-down is greater than or equal to a predetermined value;

(i) determining defect conditions from said open circuit voltage; and (j) determining defect conditions from the current voltage characteristics generated in step (b).

2. A method as recited in claim 1, further comprising the steps of:

(a) charging said battery automatically at a predetermined charge rate until the battery voltage equals the true number of cells multiplied by a predetermined voltage which is characteristic of the battery;

(b) charging said battery at a constant voltage equal to voltage in step (a) until the charge current decreases to a predetermined low value;

(c) charging said battery with a predetermined constant current at any voltage for a predetermined period of time;

(d) repeating steps (b) and (e) in claim 1 and step (c) in claim 2 until said Igas-down reaches a predetermined lower limit which is characteristic of the desired state of charge of the battery; and (e) determining the said battery's capability to accept charge from the charge input to said battery.

3. A method according to claim 2 wherein said battery is a lead acid battery.

4. The method according to claim 1 wherein the estimated number of cells in the battery is the minimum number of cells estimated by the formula:

*minimum number of cells* $=(OCV/V_1)$ wherein the value of $V_1$ corresponds to the cell voltage of a completely charged cell and OCV is the open circuit voltage.

5. The method according to claim 1 wherein the estimated number of cells in the battery is the maximum number of cells estimated by the formula:

*maximum number of cells* $=(OCV/V_2)$ wherein the value of $V_2$ corresponds to the cell voltage of a completely discharged cell and OCV is the open circuit voltage of said battery.

6. The method according to claim 1 wherein the maximum number of cells (MAXCEL) is the true number of cells when the estimated number of cells is smaller than a predetermined value and wherein the battery is charged in step (c) of claim 1 at a voltage corresponding to the MAXCEL.

7. The method according to claim 4 wherein the battery is charged until the battery voltage equals the minimum number of cells times a predetermined Voltage.

8. A method according to claim 4 wherein the true number of cells is determined by dividing Vgas by $V_3$ wherein $V_3$ is a voltage characteristic of the type of battery. $V_3$ is a value from about 2.35 to about 2.60 V for lead acid batteries.

9. A method according to claim 8 wherein $V_3$ is 2.5 V for lead acid batteries.

10. A method according to claim 1 wherein steps (b) and (e) comprise:

(a) monotonously increasing the battery voltage over a predetermined period of time from the open circuit voltage to a predetermined high limit voltage which is characteristic of the type of battery and holding said voltage at said high limit value for a predetermined period of time and monotonously decreasing the battery voltage from said high limit value over a predetermined period of time to the open circuit voltage;

(b) measuring the response current and/or impedance during said increasing and decreasing voltage;

(c) analyzing the data using the differential dI/dV vs. I or V, wherein I is the current and V is the voltage, or dZ/dV vs. I or V wherein I is the current, V is the voltage and Z is the impedance; and (d) determining the gas evolution parameters by the presence of one or more minima in dI/dV or dZ/dV in the increasing voltage direction and the gas stopping points by the presence of one or more minima in dI/dV or dZ/dV in the decreasing direction of said voltage.

11. A method according to claim 1 wherein steps (b) and (e) comprise:

(a) monotonously increasing the battery voltage over a predetermined period of time from the open circuit voltage to a predetermined high limit voltage which is characteristic of the type of battery and holding said voltage at said high limit value for a predetermined period of time and monotonously decreasing the battery voltage from said high limit value over a predetermined period of time to the open circuit voltage;

(b) measuring the response current during said increasing and decreasing voltage;

(c) analyzing the data using the differential dI/dV vs. I and/or V, wherein I is the current and V is the voltage; and (d) determining the gas evolution parameters by the presence of one or more minima in dI/dV in the increasing voltage direction and the gas stopping points by the presence of one or more minima in dI/dV in the decreasing direction of said voltage.

12. A method as recited by claim 1, wherein said defect conditions determined in step (j) comprise reverse connection of the battery leads to the apparatus, the measured open circuit voltage being less than a predetermined voltage, particularly −1 V.

13. A method as recited in claim 1, wherein said defect conditions, determined in step (j) comprise improper connections of the battery to the apparatus, the measured open circuit voltage being less than a predetermined voltage and higher than another predetermined voltage.

14. A method as recited by claim 1, wherein said defect conditions determined in step (j) comprise open circuit voltage greater than a predetermined voltage, substantially zero current flowing through the battery in response to an applied voltage substantially greater than the open circuit voltage.

15. A method as recited in claim 14, wherein said defect conditions determined in step (j) are at least one of the following defective conditions:
    (a) bad connections;
    (b) corroded terminals;
    (c) loss of electrolyte; and
    (d) bad relay type components in said apparatus.

16. A method as recited by claim 1, wherein said defect conditions determined in step (j) comprise said battery having cells mismatched in capacity said mismatch being indicated by the presence of multiple gas evolution points in the increasing current voltage direction and one or more gas stopping points in the decreasing current or voltage direction.

17. A method as recited by claim 1, wherein said defect conditions determined in step (j) comprise said battery having a defect caused by sulfated cell, said defect being indicated by the presence of one or more current-voltage inflections in the increasing current or voltage direction coupled with the absence of corresponding gas stopping point in the decreasing current or voltage direction.

18. A method as recited in claim 1, wherein said defect conditions determined in step (j) comprise said battery having a defect caused by soft-shorted cell(s), said defect being indicated by a disproportionately low value for one of the Igas-up parameters or a jump or a minimum predetermined increased in open circuit voltage due to step (b) in claim 1.

19. A method as recited in claim 1, wherein the internal resistance of the battery is determined from two sets of Igas-up and Vgas-up parameters, each of said sets corresponding to different states of charge of said battery.

20. A method as recited in claim 19 wherein said defect conditions are indicated by comparing the determined internal resistance with the corresponding value characteristic of said battery size and capacity stored in memory.

21. A method according to claim 1, wherein steps (b) and (e) comprise:
    (a) monotonously increasing the battery current over a predetermined period of time from zero or substantially zero current to a predetermined high limit current and holding said current at said high limit value for a predetermined period of time and monotonously decreasing said current from said high limit value over a predetermined period of time to zero or substantially zero current;
    (b) measuring the response battery voltage and/or impedance during said increasing and decreasing current;
    (c) analyzing the data using the differential dV/dI vs. I or V, wherein I is the ucrrent and V is the voltage, or dZ/dI vs. I or V wherein I is the current, V is the voltage and Z is the impedance; and
    (d) determining the gas evolution parameters by the presence of one or more maxima in dV/dI or dZ/dI in the increasing current direction and the gas stopping points by the presence of one or more maxima in dV/dI or dZ/dI in the decreasing direction of said voltage.

* * * * *